(12) United States Patent
Pereira

(10) Patent No.: US 7,972,710 B2
(45) Date of Patent: Jul. 5, 2011

(54) CLAD ALUMINUM CONNECTOR

(75) Inventor: John Pereira, Rehoboth, MA (US)

(73) Assignee: Antaya Technologies Corporation, Cranston, RI (US)

( * ) Notice: Subject to any disclaimer, the term of this patent is extended or adjusted under 35 U.S.C. 154(b) by 905 days.

(21) Appl. No.: 11/891,044

(22) Filed: Aug. 8, 2007

(65) Prior Publication Data

US 2008/0057799 A1 Mar. 6, 2008

Related U.S. Application Data

(60) Provisional application No. 60/841,699, filed on Aug. 31, 2006.

(51) Int. Cl.
*B32B 15/20* (2006.01)
*B32B 15/04* (2006.01)
*B23K 1/00* (2006.01)
*H01R 43/02* (2006.01)

(52) U.S. Cl. ........ 428/652; 428/929; 428/647; 428/630; 428/209; 428/433; 29/874; 29/879; 228/122.1

(58) Field of Classification Search ........................ None
See application file for complete search history.

(56) References Cited

U.S. PATENT DOCUMENTS

| | | | |
|---|---|---|---|
| 2,513,365 A * | 7/1950 | Rogoff | ............................ 439/874 |
| 2,612,682 A | 10/1952 | Burrack | |
| 2,813,332 A | 11/1957 | Keay, Jr. | |
| 2,987,814 A | 6/1961 | Singleton, Jr. et al. | |
| 3,148,086 A * | 9/1964 | Seibert | ............................ 427/123 |
| 3,268,701 A | 8/1966 | La Plante et al. | |
| 3,384,951 A | 5/1968 | Binger | |
| 3,402,255 A * | 9/1968 | Parker | ............................ 428/595 |
| 3,514,572 A | 5/1970 | Toritani et al. | |
| 3,570,118 A | 3/1971 | Reynolds et al. | |
| 3,574,570 A | 4/1971 | Gwyn, Jr. | |
| 3,598,550 A * | 8/1971 | Takahashi | ..................... 428/621 |
| 3,616,982 A | 11/1971 | Dion | |
| 3,665,267 A * | 5/1972 | Acello | ........................ 361/309 |
| 3,684,464 A | 8/1972 | Happ et al. | |
| 3,714,701 A | 2/1973 | Dion et al. | |
| 4,290,665 A * | 9/1981 | Krasnov et al. | ............... 439/886 |
| 4,437,236 A | 3/1984 | Oswald, Jr. | |
| 4,521,476 A * | 6/1985 | Asai et al. | ..................... 428/209 |
| 4,695,515 A | 9/1987 | Shirai et al. | |
| 4,723,923 A | 2/1988 | Senor et al. | |
| 4,980,245 A | 12/1990 | Marino | |
| 5,213,638 A | 5/1993 | Mahulikar et al. | |

(Continued)

FOREIGN PATENT DOCUMENTS

DE  27 31 850 A1  1/1979

(Continued)

OTHER PUBLICATIONS

English machine translation of DE 2731850. Jan. 1979.*

*Primary Examiner* — John J Zimmerman
(74) *Attorney, Agent, or Firm* — Hamilton, Brook, Smith & Reynolds, P.C.

(57) ABSTRACT

An electrical connector including a base pad formed of aluminum and having a bottom surface. An electrical contact can be connected to the base pad. A layer of copper can be on the bottom surface of the base pad.

24 Claims, 4 Drawing Sheets

U.S. PATENT DOCUMENTS

| | | | |
|---|---|---|---|
| 5,223,349 A * | 6/1993 | Kudo et al. | 428/652 |
| 5,362,926 A | 11/1994 | Fukuda et al. | |
| 5,373,111 A * | 12/1994 | McClure et al. | 174/250 |
| 5,482,789 A | 1/1996 | O'Hara et al. | |
| 5,915,998 A | 6/1999 | Stidham et al. | |
| 6,051,327 A | 4/2000 | Serafin et al. | |
| 6,081,728 A | 6/2000 | Stein et al. | |
| 6,179,953 B1 | 1/2001 | Deevi et al. | |
| 6,187,454 B1 | 2/2001 | Rivassou | |
| 6,189,770 B1 | 2/2001 | Lotz | |
| 6,238,778 B1 | 5/2001 | Schneider | |
| 6,299,986 B1 | 10/2001 | Meelu | |
| 6,487,964 B2 | 12/2002 | Snoke et al. | |
| 6,534,192 B1 | 3/2003 | Abys et al. | |
| 6,709,769 B1 | 3/2004 | Pedretti | |
| 6,770,380 B2 | 8/2004 | Steiner et al. | |
| 6,793,544 B2 | 9/2004 | Brady et al. | |
| 6,815,086 B2 | 11/2004 | Dockus et al. | |
| 6,913,184 B2 | 7/2005 | Dockus et al. | |
| 6,945,831 B2 | 9/2005 | Pereira et al. | |
| 6,955,740 B2 | 10/2005 | Rapuano et al. | |
| 7,000,823 B2 | 2/2006 | Dockus et al. | |
| 2002/0006526 A1 | 1/2002 | Polese et al. | |
| 2002/0026010 A1 * | 2/2002 | Roberts et al. | 525/66 |
| 2002/0061415 A1 | 5/2002 | Steiner et al. | |
| 2002/0100371 A1 | 8/2002 | Snoke et al. | |
| 2002/0142185 A1 | 10/2002 | Kilmer | |
| 2003/0021886 A1 * | 1/2003 | Baele | 427/8 |
| 2003/0170486 A1 | 9/2003 | Austin et al. | |
| 2003/0189082 A1 | 10/2003 | Dockus et al. | |
| 2003/0211355 A1 | 11/2003 | Austin et al. | |
| 2004/0035910 A1 | 2/2004 | Dockus et al. | |
| 2004/137260 A1 | 7/2004 | Groll et al. | |
| 2008/0023833 A1 * | 1/2008 | Daubenspeck et al. | 257/737 |

FOREIGN PATENT DOCUMENTS

| | | |
|---|---|---|
| DE | 29 37 916 A1 | 3/1980 |
| EP | 1 469 486 A | 10/2004 |
| JP | 55-11128 * | 1/1980 |
| JP | 58-123685 * | 7/1983 |

* cited by examiner

CLAD ALUMINUM CONNECTOR

RELATED APPLICATION

This application claims the benefit of U.S. Provisional Application No. 60/841,699, filed on Aug. 31, 2006. The entire teachings of the above application are incorporated herein by reference.

BACKGROUND

Some electrical connectors are soldered to surfaces. In situations where a strong soldered joint is required, such as on automotive glass, there are some materials that are not used for such electrical connectors, for example, aluminum, because solder does not form a strong joint with aluminum. It is believed that natural oxides on the aluminum cause poor bonding.

SUMMARY

The present invention provides an aluminum electrical connector which can be soldered to a surface with a strong solder joint.

The present invention provides an electrical connector including a base pad formed of aluminum and having a bottom surface. An electrical contact can be connected to the base pad. A layer of copper can be on the bottom surface of the base pad.

In particular embodiments, a layer of solder can be on the layer of copper. The base pad and the electrical contact can have a layer of copper on at least one side. The electrical connector can be formed from a sheet of aluminum having a layer of copper on at least one side. The base pad and the electrical contact can have a layer of copper on two opposite sides in which the electrical connector is formed from the sheet of aluminum having a layer of copper on two opposite sides.

The present invention also provides an electrical connector including a base pad formed of aluminum. The base pad has a soldering surface. An electrical contact can be connected to the base pad. A layer of copper can be on the soldering surface of the base pad.

The present invention also provides a metallic strip and forming die combination including a metallic strip comprising an elongate strip of aluminum having a layer of copper on at least one side, and a predetermined pattern of solder on the layer of copper. The pattern of solder can have at least one elongate strip of solder extending longitudinally along the metallic strip with a predetermined width and at a predetermined distance from the edge of the metallic strip. A forming die is configured for forming the metallic strip into electrical connectors having base pads. The predetermined pattern of solder on the metallic strip can be sized and positioned for forming the base pads with a layer of solder on the layer of copper.

In particular embodiments, the metallic strip can have a layer of copper on two opposite sides. The pattern of solder can be centrally located on the metallic strip. The pattern of solder can include at least two elongate strips of solder parallel to each other extending longitudinally along the metallic strip. In one embodiment, the pattern of solder can include one elongate strip of solder extending to one edge of the metallic strip.

The present invention also provides a laminated metallic strip including a flat elongate strip of aluminum. First and second layers of copper can be on opposite surfaces of the aluminum strip. A predetermined pattern of solder can be on one of the layers of copper. The pattern of solder can have at least one elongate strip of solder extending longitudinally along the metallic strip with a predetermined width and at a predetermined distance from an edge of the metallic strip.

The present invention also provides a method of forming an electrical connector including forming a base pad of aluminum having a bottom surface and an electrical contact connected to the base pad. A layer of copper can be provided on the bottom surface of the base pad.

In particular embodiments, a layer of solder can be provided on the layer of copper. The base pad and the electrical contact can be provided with a layer of copper on at least one side. The electrical connector can be formed from a sheet of aluminum having a layer of copper on at least one side. The base pad and the electrical contact can be provided with a layer of copper on two opposite sides. The electrical connector can be formed from a sheet of aluminum having a layer of copper on opposite sides. Two sheets of copper can be combined with a sheet of aluminum with a rolling process to form a copper clad sheet. A layer of solder can be formed on the copper clad sheet to form a solder clad sheet. The solder clad sheet can be trimmed. The electrical connectors can be formed from the solder clad sheet with a forming die.

The present invention also provides a method of forming an electrical connector including forming a base pad of aluminum having a soldering surface and an electrical contact connected to the base pad. A layer of copper can be provided on the soldering surface of the base pad.

The present invention also provides a method of forming electrical connectors including providing a metallic strip comprising a strip of aluminum having a layer of copper on at least one side, and a predetermined pattern of solder on the layer of copper. The pattern of solder can have at least one elongate strip of solder extending longitudinally along the metallic strip with a predetermined width and at a predetermined distance from an edge of the metallic strip. The metallic strip can be formed into electrical connectors having base pads with a forming die. The predetermined pattern of solder can be sized and positioned for forming the base pads with a layer of solder on the layer of copper.

In particular embodiments, the metallic strip can be provided with a layer of copper on two opposite sides. The pattern of solder can be centrally located on the metallic strip. The pattern of solder can be formed with at least two elongate strips of solder parallel to each other extending longitudinally along the metallic strip. In one embodiment, the pattern of solder can be formed with one elongate strip of solder extending to one edge of the metallic strip.

The present invention also provides a method of forming a metallic strip including forming first and second layer of coppers on opposite surfaces of a flat elongate strip of aluminum. A predetermined pattern of solder can be formed on one of the layers of copper. The pattern of solder can have at least one elongate strip of solder extending longitudinally along the metallic strip with a predetermined width and at a predetermined distance from the edge of the metallic strip.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

Figure 1:
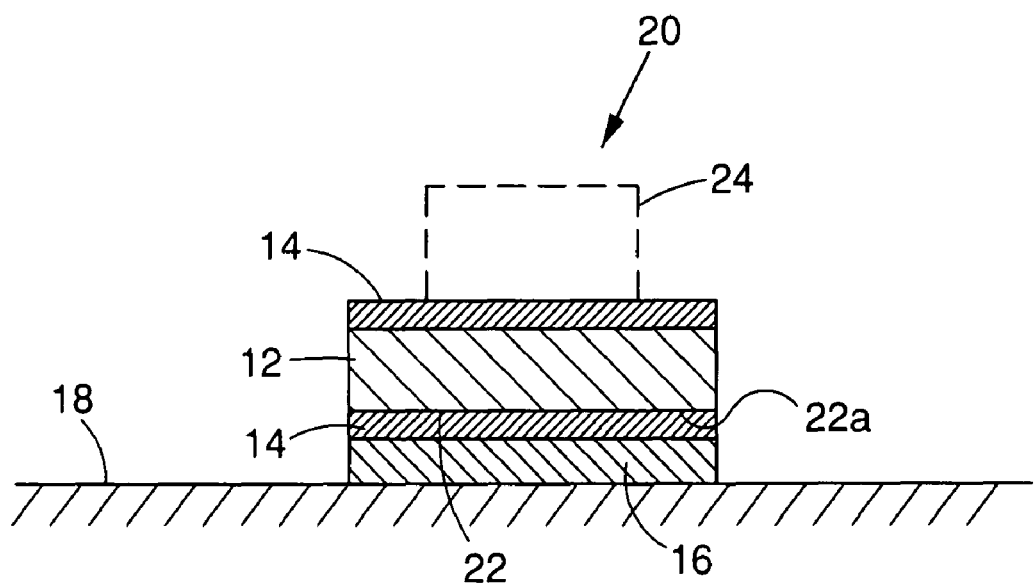
FIG. 1 is a schematic drawing of an electrical connector in the present invention.

Referring to FIG. 1, electrical terminal or connector 20 can be generally formed of aluminum 12. The electrical connector 20 can have a base pad portion 22 for soldering to a surface 18 with solder 16, and an electrical contact portion 24 for electrically connecting to a mating connector, device, or conductor. In some embodiments, the electrical connector 20 can include a layer of solder 16 on the base pad portion 22, thereby simplifying the soldering process since solder does not have to be added at the time of soldering. The base pad portion 22 and the contact portion 24 are generically shown, and it is understood that the base pad portion 22 and the contact portion 24 can have different configurations.

The base pad portion 22 can have a thin layer of copper 14 laminated or formed on the bottom or soldering surface 22a. Although solder typically forms a poor or weak joint with aluminum, the Applicant has found that the solder 16 can form a strong solder joint with the layer of copper 14 and that the copper layer 14 can be strongly clad or bonded to the aluminum 12 of the base pad portion 22 in a manner that does not delaminate under normal circumstances. As a result, during soldering, the solder 16 can bond to the copper layer 14 on the base pad portion 22 with a strong solder joint, thereby allowing the aluminum electrical connector 20 to be soldered to the surface 18 with a strong solder joint. A strong solder joint that does not easily separate is desirable in situations, for example, when soldering an electrical connector 20 to a surface 18 such as automotive glass.

Figure 2:
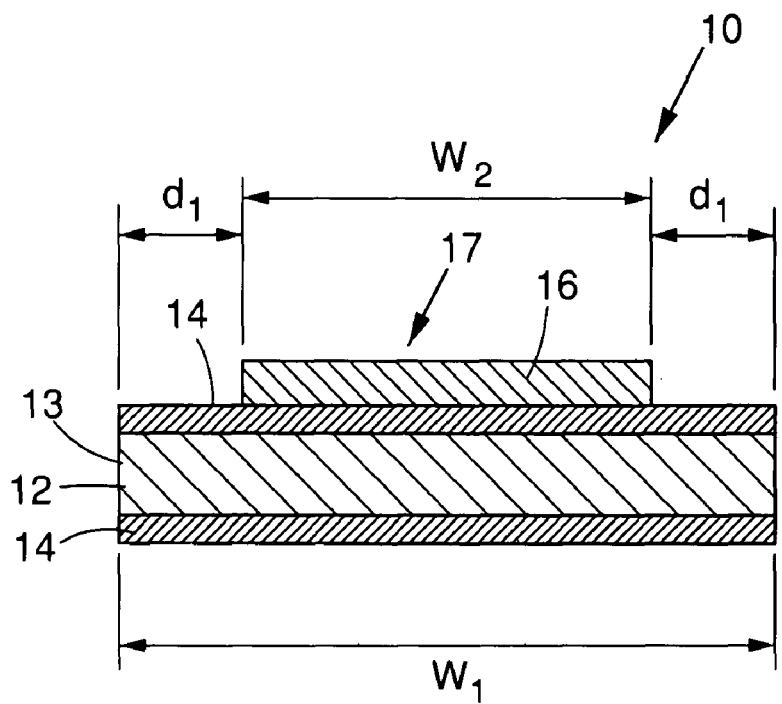
FIG. 2 is a cross section of an embodiment of a solder clad ribbon.

The electrical connector 20 can be formed from a copper clad flat elongate sheet, ribbon or strip 13 having a consistent predetermined dimension or width $W_1$. The copper clad ribbon 13 can have a thin layer of copper 14 on opposite sides or surfaces of a flat elongate sheet, core, ribbon or strip of aluminum 12 (FIG. 2). If desired, the copper clad ribbon 13 can also include a layer of solder 16, of a consistent predetermined or desired pattern 17, resulting in a flat elongate solder clad ribbon 10. For example, the layer of solder 16 can have a consistent predetermined dimension or width $W_2$ and can be spaced from one or both edges or sides of the copper clad ribbon 13 by a consistent predetermined dimension or distance $d_1$.

Consequently, the electrical connector 20 that is formed from solder clad ribbon 10, can be copper clad, with both the base pad portion 22 and the contact portion 24 having layers of copper 14 on opposite sides. The two outer layers of copper 14 can eliminate, prevent or slow the formation of oxides on the aluminum 12 of the electrical connector 20, and can provide better or more consistent electrical contact of the base pad portion 22 and the contact portion 24 with mating surfaces, devices, connectors or conductors. In addition, the two layers of copper 14 can increase the power carrying capacity of the electrical connector 20, which can be desirable in applications, such as, for providing electrical power to a window defroster. By forming the electrical connector 20 generally or mostly from aluminum, the electrical connector 20 can be light weight, and can be made at a low cost. In addition, by having a layer of copper 14 on the bottom surface 22a of the base pad portion 22, the base pad portion 22 of the electrical connector 20 can be soldered to a surface 18 with a strong solder joint.

Figure 3:
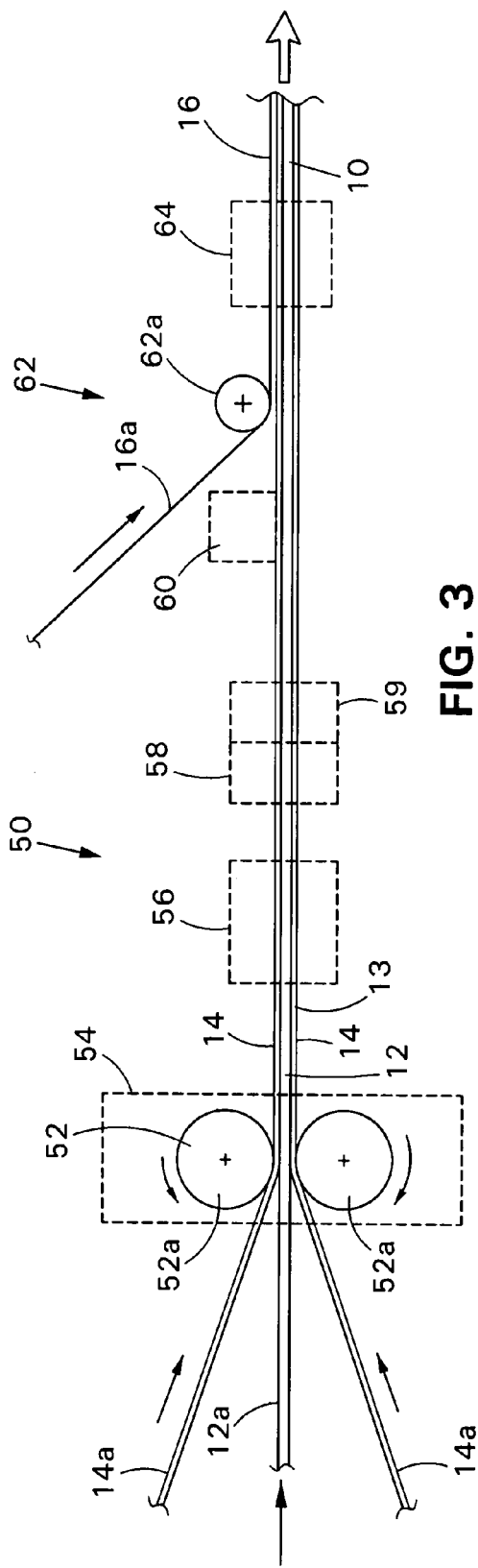
FIG. 3 is a schematic drawing of an apparatus and process for forming a solder clad ribbon.

Referring to FIG. 3, solder clad ribbon 10 can be formed by an apparatus 50. Two thin flat elongate sheets, ribbons or strips 14a of copper 14 and a flat elongate sheet, ribbon or strip 12a of aluminum 12 can be supplied, for example, from supply rolls and combined together in a rolling operation by a rolling apparatus 52 between rollers 52a. One ribbon 14a of copper 14 is rolled onto one face, surface or side of the ribbon 12a of aluminum 12, the other ribbon 14a of copper 14 is rolled onto the opposite face, surface or side. The original thickness of the ribbons 14a and 12a of copper 14 and aluminum 12 can be reduced during the rolling process, thereby bonding and laminating two layers of copper 14 and one layer of aluminum 12 together to form copper clad ribbon 13. It is believed that the rolling process breaks up the oxide layer on the aluminum 12 and allows the copper 14 to strongly bond to the aluminum 12 under pressure. The rolling apparatus 52 can perform the rolling process as a hot rolling process where heat can be provided by a heating apparatus 54. Alternatively, the rolling process can be a cold rolling process. The copper clad ribbon 13 can be annealed by or within an annealing device or oven 56 to remove stresses and/or work hardening, and/or reduce brittleness. In other embodiments, the ribbon 12a of aluminum 12 can be electroplated with layers of copper 14. The copper clad ribbon 13 can then have flux applied at a flux station 60 such as by a roller, brush, nozzle or doctor blade. A flat elongate sheet, strip or ribbon 16a of solder 16 can then be applied on the copper clad ribbon 13 over the flux at station 62, for example, by a roller 62a. The ribbon 16a of solder 16 can then be reflowed by heating at reflow station 64 to form clad ribbon 10. Alternatively, the solder 16 can be applied by a rolling process or by a casting process. In some embodiments, the copper clad ribbon 13 can be wound onto a spool at a windup station 58 for later processing. In addition, copper clad ribbon 13 can be provided to flux station 60 from a spool at an unwind station 59.

Figure 4:
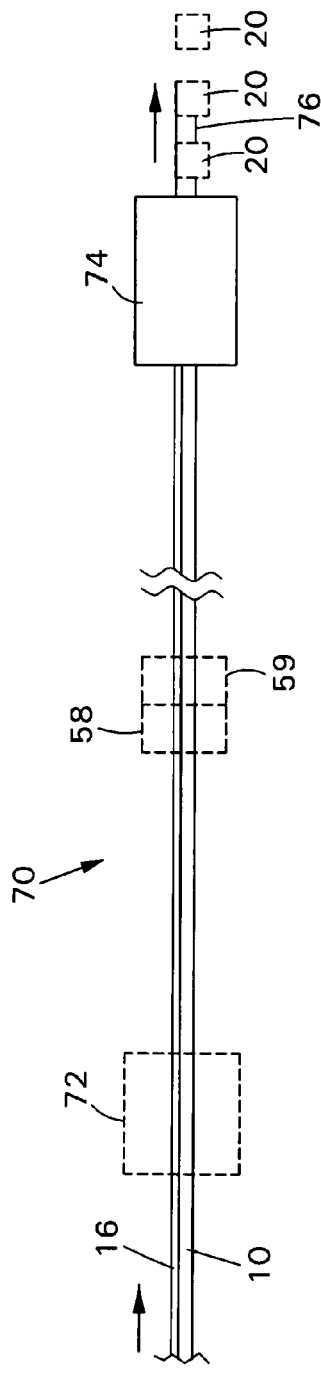
FIG. 4 is a schematic drawing of an apparatus and process for forming electrical connectors.

Referring to FIG. 4, if desired, the solder clad ribbon 10 can be trimmed and/or slit by apparatus 70 at a trimming station 72. The trimming station 72 can trim the copper clad ribbon 13 and/or the solder 16 to desired dimensions and configurations. The solder 16 can be trimmed, cut or contoured by skiving. The trimmed solder clad ribbon 10 can then be formed into the desired electrical connectors 20 by a forming or stamping die 74. The forming die 74 can include various movable components or members for performing stamping, cutting and bending operations on the solder clad ribbon 10 for forming the desired electrical connectors 20, as known in the art. Electrical connectors 20 with different configurations can require forming die 74 to conduct different operations. The electrical connectors 20 can emerge from the forming die 74 connected together by carrier strips 76 for winding onto a spool, or can be formed into individual electrical connectors 20.

In some embodiments, after trimming and/or slitting at trimming station 72, the trimmed clad ribbon(s) can be wound onto a spool at a windup station 58 for later processing. In addition, solder clad ribbon 10 can be provided to forming die 74 from a spool at an unwind station 59.

Figure 5:
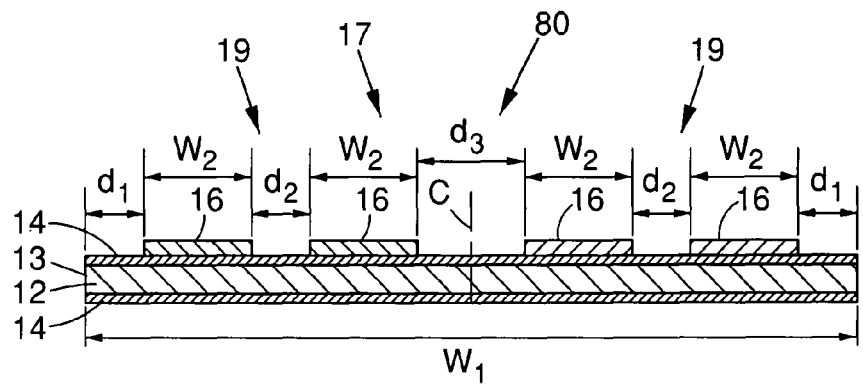
FIGS. 5-8 depict cross sectional views of embodiments of solder clad ribbons.

FIGS. 5-8 depict examples of solder clad ribbons with different configurations or patterns 17 of solder 16 for forming different electrical connectors. Referring to FIG. 5, solder clad ribbon 80 can have a pattern 17 with four strips of solder 16 each having a width $W_2$ positioned on a copper clad ribbon 13. The strips of solder 16 can be in two pairs 19 that are spaced from the edge of the copper clad ribbon 13 by a distance $d_1$. The strips of solder 16 in each pair 19 can be spaced apart from each other by a consistent predetermined distance $d_2$. The two pairs 19 can be spaced apart by a consistent predetermined central gap or distance $d_3$ that can be centered on a central axis C. The distance $d_3$ can be about twice the distance of $d_1$. The solder 16 can be applied to the copper clad ribbon 13 as a single strip or ribbon 16a, or two strips or ribbons 16a which are then trimmed into four strips. Alternatively, four individual strips or ribbons 16a of solder 16 can be applied onto the copper clad ribbon 13.

Figure 6:
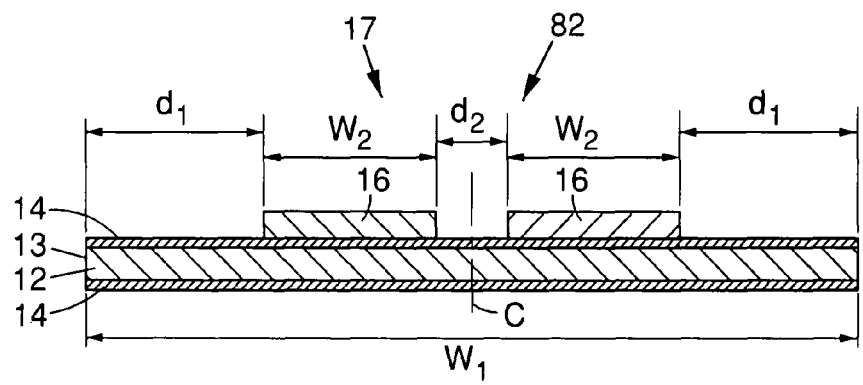

Referring to FIG. 6, solder clad ribbon 82 can have a pattern 17 of two strips of solder 16 each having a width $W_2$ and spaced apart from each other by a distance $d_2$, and spaced from the edge of the copper clad ribbon 13 by a distance $d_1$. Solder clad ribbon 82 can be formed by slitting solder clad ribbon 80 in half along central axis C. Alternatively, solder clad ribbon 82 can be formed by trimming a single strip of solder 16 on the copper clad ribbon 13 into two strips, or applying two individual strips or ribbons 16a of solder 16 onto the copper clad ribbon 13.

Figure 7:
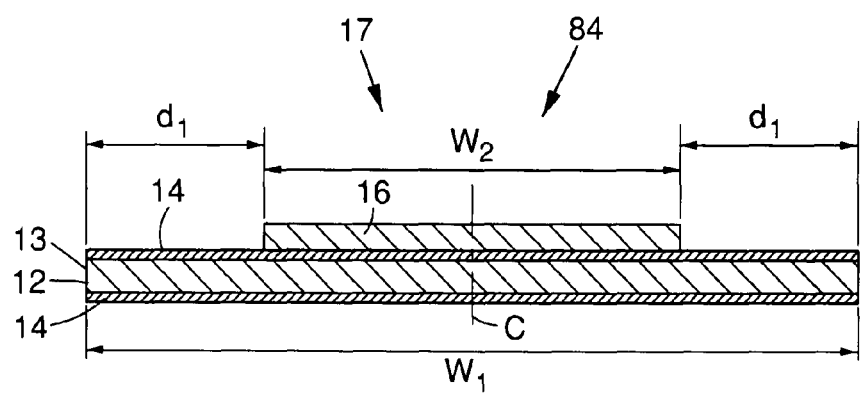
Figure 8:
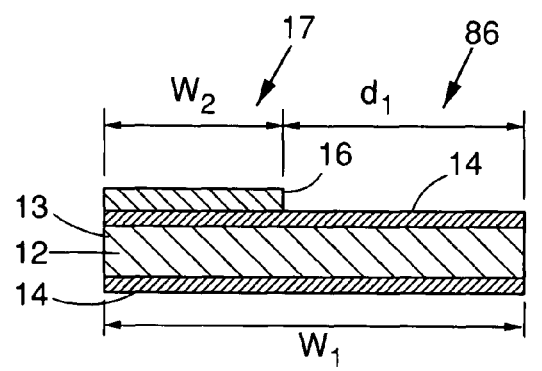

Referring to FIG. 7, solder clad ribbon 84 can have a pattern 17 of solder 16 including a single centrally positioned strip of solder 16 with a width $W_2$ on the copper clad ribbon 13 that is spaced a distance $d_1$ from the edges. Referring to FIG. 8, solder clad ribbon 86 can have a pattern 17 with single strip of solder 16 having a width $W_2$ that is positioned along one side or edge of the copper clad ribbon 13 and spaced from the other edge by distance $d_1$. Solder clad ribbon 86 can be formed by slitting solder clad ribbon 84. Alternatively, solder clad ribbon 86 can be formed by applying a strip or ribbon 16a of solder 16 at the appropriate location or position.

In some embodiments, the width $W_1$ of the copper clad ribbon 13 can range between about 1-4 inches. The width $W_2$ of the strips of solder 16 can range between about ⅜ inches to about 1¼ inches. The copper clad ribbon 13 can be about 0.030 inches thick, the copper layers 14 can be about 0.001 to 0.002 inches thick (often about 0.0015 inches), and the solder layer 16 can be about 014 to 0.030 inches thick. In another embodiment, the copper clad ribbon 13 can be about 0.012 inches thick, the copper layers 14 can be about 0.0006 inches thick, and the solder layer 16 can be about 0.013 inches thick. The configurations, patterns 17, and dimensions can vary depending upon the desired electrical connector configuration that is formed or stamped. Depending upon the situation at hand, other suitable configurations, patterns 17 and dimensions can be employed.

The aluminum ribbon 12 can be formed of ductile aluminum, such as 1100 aluminum. The copper layers 14 can be formed of 102-110 copper. The solder layer 16 can be formed of any suitable solder including leaded and non-leaded solders. In one embodiment, the solder 16 can be about 25% Sn, 62% Pb, 10% Bi, 3% Ag.

In another embodiment, the solder 16 can have a non-lead composition of about 65% In, 30% Sn, 0.5% Cu and 4.5% Ag. The solder 16 can have a low melting temperature with a solidus temperature of about 118° C. (245° F.) and a liquidus temperature of about 121° C. (250° F.).

In addition, other suitable compositions including non-lead compositions can be used for solder 16, including those disclosed in U.S. patent application Ser. No. 11/805,250, filed May 21, 2007, the entire contents of which are incorporated herein by reference. In one embodiment, the solder 16 can be about 60% tin (Sn), about 35% indium (In), about 4.5% silver (Ag) and about 0.5% copper (Cu). The exact percentages can vary slightly due to normal variations in manufacturing, for example, about 59% to 61% Sn, about 34% to 36% In, about 4% to 5% Ag and about 0.4% to 0.6% Cu. The melting point or melting temperature (liquidus) can be about 300° F. (149° C.) and the solidus can be about 235° F. (113° C.). In another embodiment, the solder 16 can be about 50% Sn, about 46% In, about 3.5% Ag and about 0.5% Cu. The exact percentages can vary slightly due to normal variations in manufacturing, for example, about 49% to 52% Sn, about 45% to 47% In, about 3% to 4% Ag and about 0.4% to 0.6% Cu. The melting point or melting temperature (liquidus) can be about 240° F. (116° C.) and the solidus can be about 235° F. (113° C.).

In other embodiments, solder composition 16 can include tin (Sn), indium (In), silver (Ag), and bismuth (Bi) and if desired, copper (Cu). The bismuth can provide a paste range between the liquidus and solidus temperatures which in some embodiments, can be as small as about 30° F. and as large as about 140° F. In some embodiments that contain bismuth, the melting temperature (liquidus) can be above 310° F., for example, approaching 400° F., and a proper amount of bismuth can keep the solidus temperature below about 330° F., commonly below about 315° F. Some embodiments of the solder 16 can have a solidus temperature of about 310° F. and less, for example, about 305° F. and less.

One compositional range can be about 30% to 85% tin, about 13% to 65% indium (often about 15% to 65%), about 1% to 10% silver, and about 0.25% to 6% bismuth, by weight. Some embodiments can include about 50% to 85% tin (often about 50% to 83%), and about 13% to 45% indium (often about 15% to 45%). Additional embodiments can include about 66% to 85% tin (often about 66% to 83%), and about 13% to 26% indium (often about 15% to 26%). Particular embodiments can include about 70% to 80% tin, and about 15% to 26% indium. Further embodiments can include copper, for example 0.25% to 0.75%. In some embodiments there can be about 1% to 6% silver, about 0.25% to 4% bismuth and about 0.25% to 0.75% copper.

In one embodiment, solder 16 can include about 51% tin, about 42% indium, about 3.5% silver, about 3% bismuth and about 0.5% copper. The actual percentages can vary slightly due to normal variations in manufacturing, for example about 49% to 52% tin, about 40% to 44% indium, about 1% to 6% silver, about 0.25% to 4% bismuth, and about 0.25% to 0.75% copper. The melting point or temperature (liquidus) can be about 253° F. (123° C.) and the solidus can be about 223° F. (106° C.), resulting in a paste range of about 30° F.

In another embodiment, solder 16 can include about 60% to 63% tin, about 28% to 33% indium, about 1% to 6% silver, about 0.25% to 4% bismuth, and about 0.25% to 0.75% copper. For example, solder 16 can include about 62% tin, about 30% indium, about 5% silver, about 2.5% bismuth, and about 0.5% copper. The melting point or temperature (liquidus) can be about 311° F. (155° C.) and the solidus can be about 226° F. (108° C.), resulting in a paste range of about 85° F. In another example, the solder 16 can include about 62% tin, about 32% indium, about 4.5% silver, about 1% bismuth and about 0.5% copper. The melting point or temperature (liquidus) can be about 336° F. (169° C.) and the solidus can be about 199° F. (93° C.), resulting in a paste range of about 137° F. The coefficient of thermal expansion (CTE) can be about $11 \times 10-6/°$ F. ($19.7 \times 10-6/°$ C.).

In still another embodiment, solder 16 can include about 68% tin, about 24% indium, about 6% silver, about 1.5% bismuth and about 0.5% copper. The actual percentages can vary slightly, for example, about 66% to 69% tin, about 22% to 26% indium, about 1% to 7% silver, about 0.25% to 4% bismuth, and about 0.25% to 0.75% copper. The melting point or temperature (liquidus) can be about 360° F. (182° C.) and the solidus can be about 235° F. (113° C.), resulting in a paste range of about 125° F. The coefficient of thermal expansion (CTE) can be about 10.9×10–6/° F. (19.6×10–6/° C.).

In another embodiment, solder 16 can include about 70% to 74% tin, about 18% to 26% indium, about 1% to 6% silver, about 0.25% to 4% bismuth, and about 0.25% to 0.75% copper. For example, solder 16 can include about 72% tin, about 19% indium, about 5% silver, about 3.5% bismuth and about 0.5% copper. The melting point or temperature (liquidus) can be about 370° F. (188° C.) and the solidus can be about 273° F. (134° C.), resulting in a paste range of about 97° F. The coefficient of thermal expansion (CTE) can be about 10.8×10–6/° F. (19.5×10–6/° C.). In another example, solder 16 can include about 72% tin, about 24% indium, about 2% silver, about 1.5% bismuth and about 0.5% copper.

In another embodiment, solder 16 can include about 73% to 78% tin, about 17% to 22% indium, about 1% to 6% silver, about 0.25% to 4% bismuth, and about 0.25% to 0.75% copper. For example, solder 16 can include about 75% tin, about 19% indium, about 3.5% silver, about 2% bismuth and about 0.5% copper. The melting point or temperature (liquidus) can be about 381° F. (194° C.) and the solidus can be about 284° F. (140° C.), resulting in a paste range of about 97° F. The coefficient of thermal expansion (CTE) can be about 10×10–6/° F. (18×10–6/° C.) and the density can be about 7.4 g/cm3. In another example, solder 16 can include about 75% tin, about 20.5% indium, about 2.5% silver, about 1.5% bismuth and about 0.5% copper. The melting point or temperature (liquidus) can be about 372° F. (189° C.) and the solidus can be about 278° F. (137° C.), resulting in a paste range of about 94° F. In another example, solder 16 can include about 77% tin, about 18% indium, about 3% silver, about 1.5% bismuth and about 0.5% copper. The melting point or temperature (liquidus) can be about 379° F. (193° C.) and the solidus can be about 297° F. (147° C.), resulting in a paste range of about 82° F. The coefficient of thermal expansion (CTE) can be about 8.8×10–6/° F. (15.9×10–6/° C.).

In another embodiment, solder 16 can include about 78% to 85% tin, about 13% to 16% indium, about 1% to 6% silver, about 0.25% to 4% bismuth, and about 0.25% to 0.75% copper. For example, solder 16 can include about 80% tin, about 15% indium, about 3.5% silver, about 1% bismuth and about 0.5% copper. The melting point or temperature (liquidus) can be about 390° F. (199° C.) and the solidus can be about 304° F. (151° C.), resulting in a paste range of about 86° F. The coefficient of thermal expansion (CTE) can be about 8.5×10–6/° F. (15.3×10–6/° C.). In another example, solder 16 can also include about 83% tin, about 13% indium, about 2.5% silver, about 1% bismuth, and about 0.5% copper. The melting point or temperature (liquidus) can be about 399° F. (204° C.) and the solidus can be about 305° F. (152° C.), resulting in a paste range of about 94° F. The coefficient of thermal expansion (CTE) can be about 7.6×10–6/° F. (13.7×10–6/° C.). In some situations, the indium content can be about 12% to 16%.

In some embodiments, additional elements may be added or substituted for in the solder composition, for example, antimony, zinc, nickel, iron, gallium, germanium, cadmium, titanium, tellurium, platinum, etc.

Figure 9:
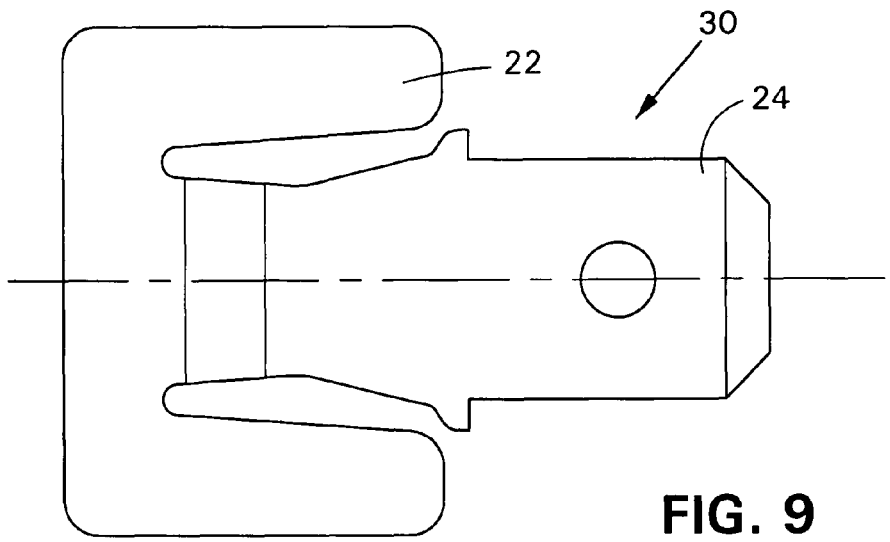
FIG. 9 is a top view of an embodiment of an electrical connector.
Figure 10:
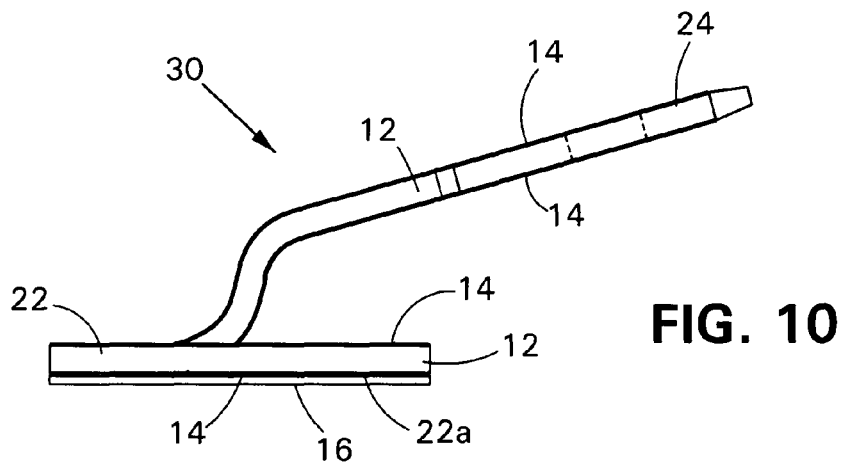
FIG. 10 is a side view of the connector of FIG. 9.

Referring to FIGS. 9 and 10, electrical connector 30 is an example of an embodiment of an electrical connector in the present invention. Electrical connector 30 can have a blade connector contact portion 24 integrally extending from the base pad portion 22. A layer of solder 16 can be located over the layer of copper 14 on the bottom or soldering surface 22a of the base pad portion 22. The electrical connector 30 can be formed of aluminum 12 that is covered on both sides with a layer of copper 14. Some embodiments of electrical connector 30 can have dimensions that are within about 1 inch square area.

Figure 11:
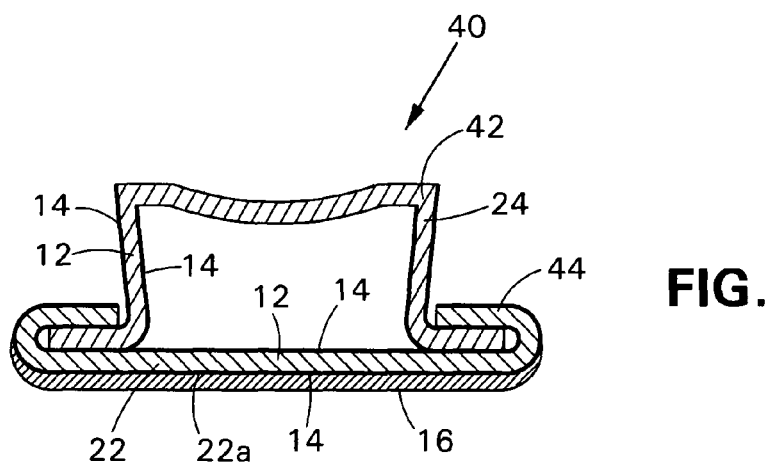
FIG. 11 is a sectional view of another embodiment of an electrical connector.

Referring to FIG. 11, electrical connector 40 is an example of another embodiment of an electrical connector 40 in the present invention. Electrical connector 40 can be a circular button connector and can be formed of two pieces, a circular post 42, and a generally circular base 44, which are assembled together. The circular post 42 can form the contact portion 24 and the base 44 can form the base pad portion 22. Both the circular post 42 and the base 44 can be formed from aluminum 12 that is covered on both sides by a layer of copper 14. As a result, the layer of solder 16 can cover the layer of copper 14 on the bottom or soldering surface 22a of the base pad portion 22. In some embodiments, the circular post 42 can be unclad, or clad on one side. In addition, the circular base 44 can be clad on one side. It is understood that a wide variety of electrical connectors can be formed in accordance with the present invention.

While this invention has been particularly shown and described with references to example embodiments thereof, it will be understood by those skilled in the art that various changes in form and details may be made therein without departing from the scope of the invention encompassed by the appended claims.

For example, the electrical connectors in some embodiments do not have solder on the base pad. In such a case, the copper clad ribbon 13 can be formed into electrical connectors by forming die 74. In addition, the soldering surface does not have to be on the bottom of the base pad, but can be on a surface facing in a different orientation.

What is claimed is:

1. An electrical connector comprising:
   a base pad formed of a sheet of aluminum having a layer of copper on at least one side and a layer of solder on at least a portion of the layer of copper, the base pad having a bottom surface;
   an electrical contact structure connected to the base pad and extending away from the base pad, the electrical contact structure being formed from the sheet of aluminum with said layer of copper; and
   the layer of solder being located on the bottom surface of the base pad and over said at least a portion of the layer of copper.

2. The connector of claim 1 in which the base pad and the electrical contact have a layer of copper on two opposite sides.

3. The connector of claim 2 in which the sheet of aluminum has a layer of copper on two opposite sides.

4. An electrical connector comprising:
   a base pad formed of a sheet of aluminum having a layer of copper bonded to opposite surfaces of the sheet of aluminum and a layer of solder on at least a portion of one layer of copper, the base pad having a soldering surface;
   an electrical contact structure connected to the base pad and extending away from the base pad, the electrical contact structure being formed from the sheet of aluminum with said layers of copper; and
   the layer of solder being located on the soldering surface of the base pad and over said at least a portion of the one layer of copper.

5. A metallic strip and forming die combination comprising:
- a metallic strip comprising an elongate strip of aluminum having a layer of copper on at least one side, and a predetermined pattern of solder on the layer of copper, the pattern of solder having at least one elongate strip of solder extending longitudinally along the metallic strip with a predetermined width and at a predetermined distance from an edge of the metallic strip; and
- a forming die configured for forming the metallic strip into electrical connectors, each having a base pad and an electrical contact structure extending away from the base pad, the predetermined pattern of solder on the metallic strip being sized and positioned relative to the die for forming the base pads with a layer of solder on the layer of copper.

6. The combination of claim 5 in which the metallic strip has a layer of copper on two opposite sides.

7. The combination of claim 6 in which the pattern of solder is centrally located on the metallic strip.

8. The combination of claim 7 in which the pattern of solder comprises at least two elongate strips of solder parallel to each other extending longitudinally along the metallic strip.

9. The combination of claim 6 in which the pattern of solder comprises one elongate strip of solder extending to one edge of the metallic strip.

10. A laminated metallic strip comprising:
- a flat elongate strip of aluminum;
- first and second layers of copper on opposite surfaces of the aluminum strip; and
- a predetermined pattern of solder on one of the layers of copper, the pattern of solder having at least one elongate strip of solder extending longitudinally along the metallic strip with a predetermined trimmed width $W_2$ and at a predetermined distance $d_1$ from a trimmed edge of the metallic strip.

11. A method of forming an electrical connector comprising:
- forming a base pad from a sheet of aluminum having a layer of copper on at least one side and a layer of solder on at least a portion of the layer of copper, the base pad having a bottom surface and an electrical contact structure connected to the base pad and extending away from the base pad, the electrical contact structure being formed from the sheet of aluminum with said layer of copper; and
- the layer of solder being located on the bottom surface of the base pad and over said at least a portion of the layer of copper.

12. The method of claim 11 further comprising providing the base pad and the electrical contact with a layer of copper on two opposite sides.

13. The method of claim 12 further comprising forming the electrical connector from a sheet of aluminum having a layer of copper on two opposite sides.

14. The method of claim 13 further comprising combining two sheets of copper with the sheet of aluminum with a rolling process to form a copper clad sheet.

15. The method of claim 14 further comprising forming a layer of solder on the copper clad sheet, to form a solder clad sheet.

16. The method of claim 15 further comprising trimming the solder clad sheet.

17. The method of claim 16 further comprising forming the electrical connectors from the solder clad sheet with a forming die.

18. A method of forming an electrical connector comprising:
- forming a base pad from a sheet of aluminum having a layer of copper bonded to opposite surfaces of the sheet of aluminum and a layer of solder on at least a portion of one layer of copper, the base pad having a soldering surface and an electrical contact structure connected to the base pad and extending away from the base pad, the electrical contact structure being formed from the sheet of aluminum with said layers of copper; and
- the layer of solder being located on the soldering surface of the base pad and over said at least a portion of the one layer of copper.

19. A method of forming electrical connectors comprising:
- providing a metallic strip comprising a strip of aluminum having a layer of copper on at least one side, and a predetermined pattern of solder on the layer of copper, the pattern of solder having at least one elongate strip of solder extending longitudinally along the metallic strip with a predetermined width and at a predetermined distance from an edge of the metallic strip; and
- forming the metallic strip into electrical connectors each having a base pad and an electrical contact structure extending away from the base pad with a forming die, the predetermined pattern of solder being sized and positioned relative to the die for forming the base pads with a layer of solder on the layer of copper.

20. The method of claim 19 further comprising providing the metallic strip with a layer of copper on two opposite sides.

21. The method of claim 20 further comprising centrally locating the pattern of solder on the metallic strip.

22. The method of claim 21 further comprising forming the pattern of solder with at least two elongate strips of solder parallel to each other extending longitudinally along the metallic strip.

23. The method of claim 20 further comprising forming the pattern of solder with one elongate strip of solder extending to one edge of the metallic strip.

24. A method of forming a metallic strip comprising:
- forming first and second layers of copper on opposite surfaces of a flat elongate strip of aluminum; and
- forming a predetermined pattern of solder on one of the layers of copper, the pattern of solder having at least one elongate strip of solder extending longitudinally along the metallic strip with a predetermined trimmed width $W_2$ and at a predetermined distance $d_1$ from a trimmed edge of the metallic strip.

* * * * *